United States Patent
Sugibayashi

(10) Patent No.: US 8,254,157 B2
(45) Date of Patent: Aug. 28, 2012

(54) SEMICONDUCTOR INTEGRATED CIRCUIT

(75) Inventor: Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 319 days.

(21) Appl. No.: 12/593,423

(22) PCT Filed: Jan. 17, 2008

(86) PCT No.: PCT/JP2008/050509
§ 371 (c)(1),
(2), (4) Date: Dec. 7, 2009

(87) PCT Pub. No.: WO2008/120480
PCT Pub. Date: Oct. 9, 2008

(65) Prior Publication Data
US 2010/0118591 A1    May 13, 2010

(30) Foreign Application Priority Data
Mar. 29, 2007    (JP) ................................ 2007-088081

(51) Int. Cl.
*G11C 11/00* (2006.01)
*G11C 7/12* (2006.01)
*G11C 7/00* (2006.01)
*G11C 7/22* (2006.01)
*G11C 11/21* (2006.01)

(52) U.S. Cl. ............... 365/148; 365/189.06; 365/189.16

(58) Field of Classification Search .................. 365/148, 365/163, 158, 171, 173, 189.06, 189.15, 365/189.16
See application file for complete search history.

(56) References Cited

U.S. PATENT DOCUMENTS

| | | | |
|---|---|---|---|
| 3,210,741 A * | 10/1965 | Cohler et al. | 365/225.5 |
| 7,286,393 B2 * | 10/2007 | Hynes et al. | 365/158 |
| 2006/0221675 A1 * | 10/2006 | Hynes et al. | 365/158 |
| 2007/0045692 A1 * | 3/2007 | Kim et al. | 257/295 |

FOREIGN PATENT DOCUMENTS

| | | |
|---|---|---|
| JP | 2006294182 A | 10/2006 |
| JP | 2006351779 A | 12/2006 |
| WO | 2006137110 A | 12/2006 |
| WO | 2007074504 A | 7/2007 |

OTHER PUBLICATIONS

International Search Report for PCT/JP2008/050509 mailed Mar. 11, 2008.
Y. Hosoi et al., "High Speed Unipolar Switching Resistance RAM (RPAM) Technology", IEEE, IEDM Technology Digest, Dec. 13, 2006, pp. 793-796.

* cited by examiner

*Primary Examiner* — J. H. Hur

(57) ABSTRACT

A semiconductor integrated circuit includes: an oxide resistance change element, a constant current source circuit supplying a write current to the oxide resistance change element, and a voltage clamper clamping a voltage in a path in which a write current flows. The voltage clamper is arranged in parallel with the path between the constant current source circuit and the oxide resistance change element.

11 Claims, 17 Drawing Sheets

SEMICONDUCTOR INTEGRATED CIRCUIT

TECHNICAL FIELD

The present invention relates to a semiconductor integrated circuit including an oxide resistance change element.

This application is the National Phase of PCT/JP2008/050509, filed Jan. 17, 2008, which is based upon and claims the benefit of priority from Japanese patent application No. 2007-088081 filed on Mar. 29, 2007, the disclosure of which is incorporated herein in its entirety by reference.

BACKGROUND ART

Due to rapidly widespread use of mobile phones or other devices in recent years, there is an increasing demand for a memory with characteristics including nonvolatility, large storage capacity, low-voltage operation and low power consumption. As a next-generation memory having these characteristics, ReRAM (Resistance RAM) with an oxide resistance change element used for a storage element attracts attention.

FIG. 1 shows a typical oxide resistance change element 10. The oxide resistance change element 10 is structured to hold a metal oxide film 11 between an upper electrode 12 and a lower electrode 13. The metal oxide film 11 is made of, for example, transition metal oxides such as TiON and NiO. According to a structure disclosed by Hosoi Y. et al., "High Speed Unipolar Switching Resistance RAM (RPAM) Technology", IEDM Technology Digest, 13 Dec. 2006, pp. 793-796, the metal oxide film 11 is made of TiON while the upper electrode 12 and the lower electrode 13 are made of TiN.

In the oxide resistance change element 10 having such a structure, an electric resistance in the metal oxide film 11 can be reversibly changed by several digits by applying a voltage pulse between the electrodes 12 and 13. More specifically, the oxide resistance change element 10 possibly has two states including a "low resistance state (i.e. metal state)" and a "high resistance state (i.e. insulator state)". When a first write voltage is applied to the oxide resistance change element 10 in a low resistance state, the oxide resistance change element 10 is brought into transition to a high resistance state. In contrast, a second write voltage is applied to the oxide resistance change element 10 in a high resistance state, the oxide resistance change element 10 is brought into transition to a low resistance state. The oxide resistance change element 10 thus stores data in a nonvolatile manner by using an electric resistance change in the metal oxide film 11 which functions as a recording layer. For example, a low resistance state is made to correspond to data "1" and a high resistance state is made to correspond to data "0".

FIG. 2 shows a structure of a write circuit with respect to the oxide resistance change element 10. A first write voltage source 101 generates a write voltage V0 for writing data "0". Meanwhile, a second write voltage source 102 generates a write voltage V1 for writing data "1". A selector 103 selects the write voltage V0 or V1 based on data to write. As a result, the write voltage V0 or V1 is applied to the oxide resistance change element 10, thereby data to write is written therein. Also, in FIG. 2, a current clamper 109 is connected in series between the second write voltage source 102 and the selector 103. In the aforementioned document, a series resistor is inserted.

FIG. 3 is a view for explaining conceptually data writing by the write circuit shown in FIG. 2. Each graph in FIG. 3 includes a lateral axis indicating a voltage applied to the oxide resistance change element 10 and a vertical axis indicating a current flowing into the oxide resistance change element 10. A broken line also indicates I-V characteristics in each of the data "1" state (i.e. low resistance state) and data "0" state (i.e. high resistance state). Since a resistance value in the data "0" state is larger than that in the data "1" state, when the same voltage is applied to the element in each state, a current flowing in the data "0" state is smaller than that in the data "1" state.

In writing data "0", the write voltage V0 is applied. If the write voltage V0 is applied to the oxide resistance change element 10 in the data "1" state, the state is brought into transition to the data "0" state. A maximum value of a current flowing at this time is Ia. In transition of the state to the data "0" state (i.e. high resistance state), a current flowing therein is reduced.

In writing data "1", the write voltage V1 is applied. The write voltage V1 is larger than the write voltage V0 (i.e. V1>V0). If the write voltage V1 is applied to the oxide resistance change element 10 in the data "0" state, the state is brought into transition to the data "1" state. In transition of the state to the data "1" state (i.e. low resistance state), a current flowing therein is increased. At this time, there is a danger that the write voltage V1, which is larger than the write voltage V0, may create an extremely large current flow to damage the oxide resistance change element 10. In order to prevent the danger, the current clamper 104 is connected in series between the second write voltage source 102 and the selector 103 as shown in FIG. 2. Owing to this current clamper 104, a current flowing in writing data "1" is suppressed to a maximum value Ib (i.e. Ib<Ia). Therefore, reciprocation of the state between the data "0" state and the data "1" state can also be prevented.

Note that a read current VR is applied in reading data. Based on a current value flowing in response to the read voltage VR, a resistance value of the oxide resistance change element 10, that is, data can be detected. The read voltage VR is established to be smaller than the write voltages V0 and V1 so as to prevent data writing in reading data.

DISCLOSURE OF INVENTION

The present inventors have focused on following features. A write voltage to cause data writing varies depending on an oxide resistance change element. A write voltage to cause data writing also has temperature dependency and pulse width dependency. Accordingly, it is necessary to control a write voltage accurately. However, in the case where a current clamper is connected in series between a write voltage source and an oxide resistance change element as stated above, the current clamper affects accuracy of a write voltage due to the nature thereof. This will make a write operation unstable. A technique is demanded to stabilize a write operation with respect to an oxide resistance change element.

A semiconductor integrated circuit according to one exemplary embodiment of the present invention includes: an oxide resistance change element, a constant current source circuit supplying a write current to the oxide resistance change element, and a voltage clamper clamping a voltage in a path in which a write current flows. The voltage clamper is arranged in parallel with the path disposed between the constant current source circuit and the oxide resistance change element.

Writing data "0" and "1" for the oxide resistance change element is controlled by a write current instead of a write voltage. The voltage clamper can be arranged in parallel with the path in which a write current flows. Accordingly, a write current can be controlled accurately with a stabilized write operation.

BEST MODE FOR CARRYING OUT THE INVENTION

Referring to accompanying drawings, a semiconductor integrated circuit according to an exemplary embodiment of the present invention will be explained. The semiconductor integrated circuit according to the present exemplary embodiment is provided with an oxide resistance change element. First, a principle to write data for the oxide resistance element according to the present exemplary embodiment will be explained.

Figure 3:
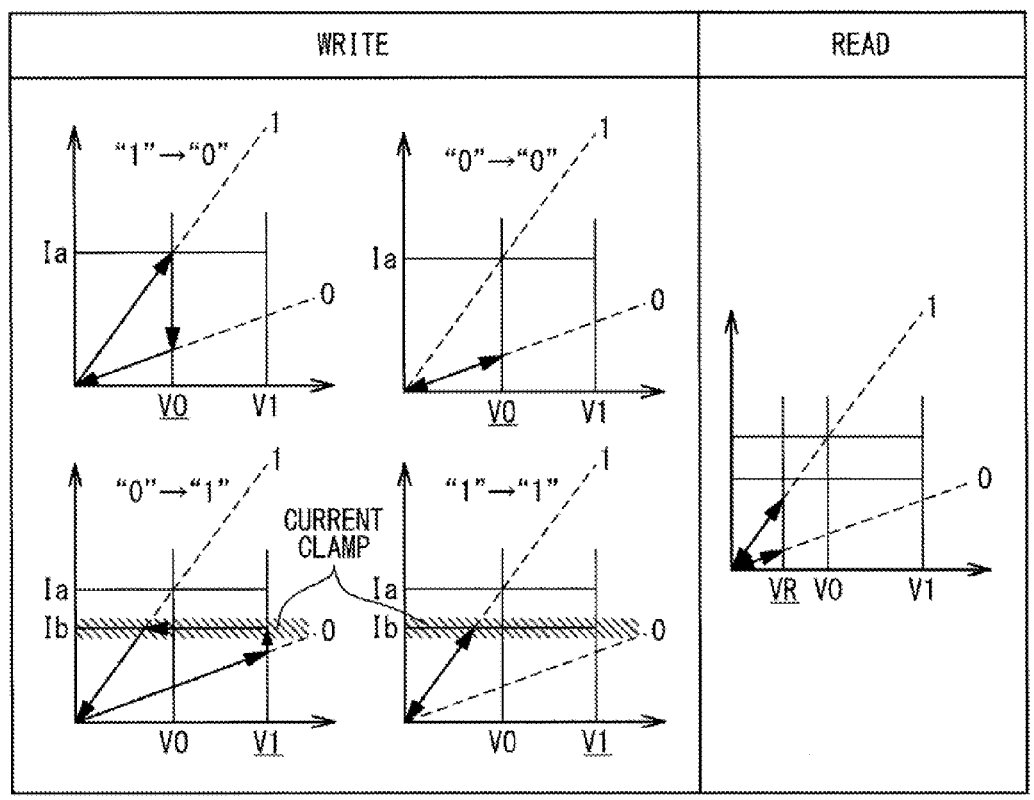
FIG. 3 is a graph to explain a typical write operation and a typical read operation.
Figure 4:
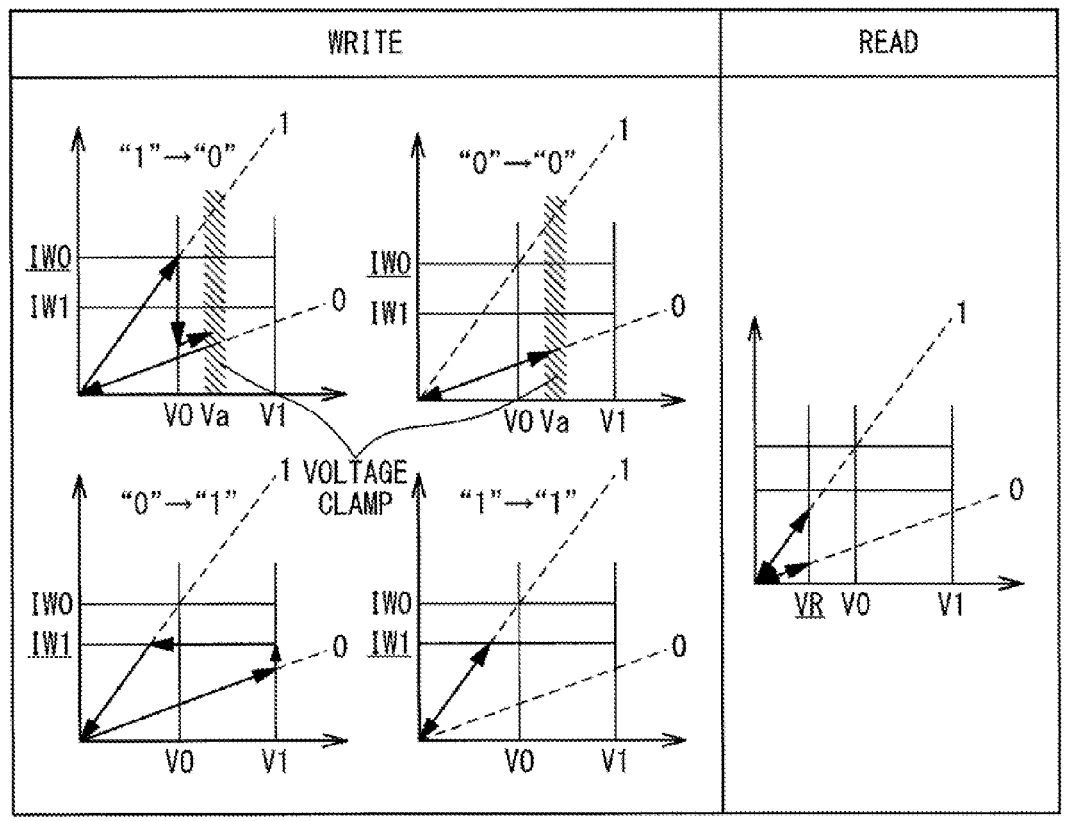
FIG. 4 is a graph to explain a write operation and a read operation according to the present invention.

FIG. 4 is a drawing to conceptually explain data writing according to the present invention, and corresponds to the aforementioned FIG. 3. According to the present invention, writing data "0" and data "1" for the oxide resistance change element is controlled by a write current instead of a write voltage.

In writing data "0", a write current IW0 is supplied to an oxide resistance change element 10. For example, there is considered a case in which the write current IW0 is made to flow in the oxide resistance change element 10 in the data "1" state (i.e. low resistance state). When the above write voltage V0 is applied to the oxide resistance change element 10 by the write current IW0, the state is then brought into transition to the data "0" state (i.e. high resistance state). Since transition of the state to the data "0" state makes a resistance value increase, there is a danger that an extremely large voltage may be applied to the oxide resistance change element 10. In order to prevent this situation, the present invention is provided with a voltage clamper. The voltage clamper clamps a voltage in a path in which the write current IW0 flows. For example, in FIG. 4, the voltage applied to the oxide resistance change element 10 is suppressed to approximately a voltage Va (i.e. V0<Va<V1). Also, reciprocation of a state between the data "0" state and the data "1" state is therefore prevented.

In writing data "1", a write current IW1 is supplied to the oxide resistance change element 10. The write current IW1 is smaller than the write current IW0 (i.e. IW1<IW0). For example, there is considered a case in which the write current IW1 is made to flow in the oxide resistance change element 10 in the data "0" state (i.e. high resistance state). The write current IW1 is applied to cause application of the above write voltage V1 to the oxide resistance change element 10 whose state is then brought into transition to the data "1" state (i.e. low resistance state). A current flowing at this time is the write current IW1, which means a large current is not made to flow in the oxide resistance change element 10. There is also no voltage clamp executed in writing data "1".

Note that a read voltage VR is applied in reading data. Based on a current value flowing in response to the read voltage VR, a resistance value in the oxide resistance change element, that is, data can be detected. The read voltage VR is established to be smaller than the voltages V0 and V1 so as to prevent data writing in reading data.

Various exemplary embodiments to realize the above write operation will be explained below in detail.

1. First Exemplary Embodiment

Figure 1:
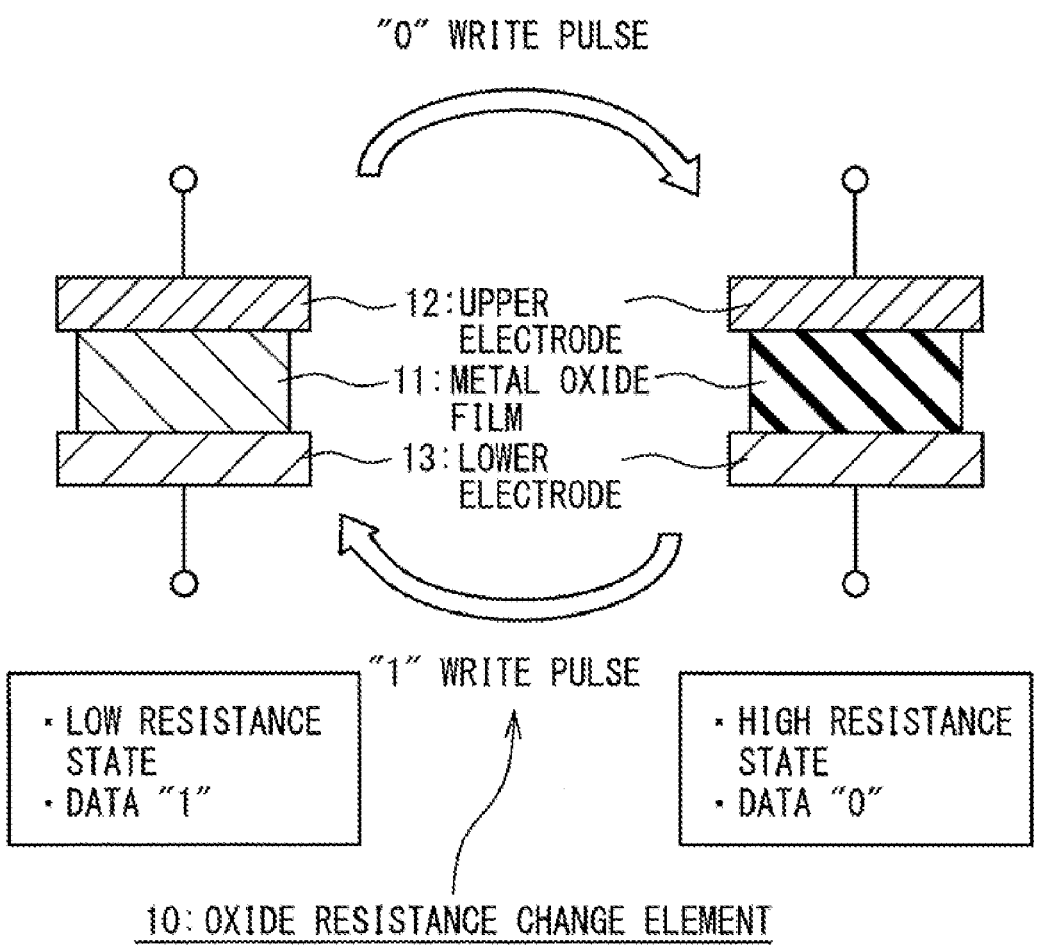
FIG. 1 is a conceptual diagram showing a structure and an operation of a typical oxide resistance change element.
Figure 2:
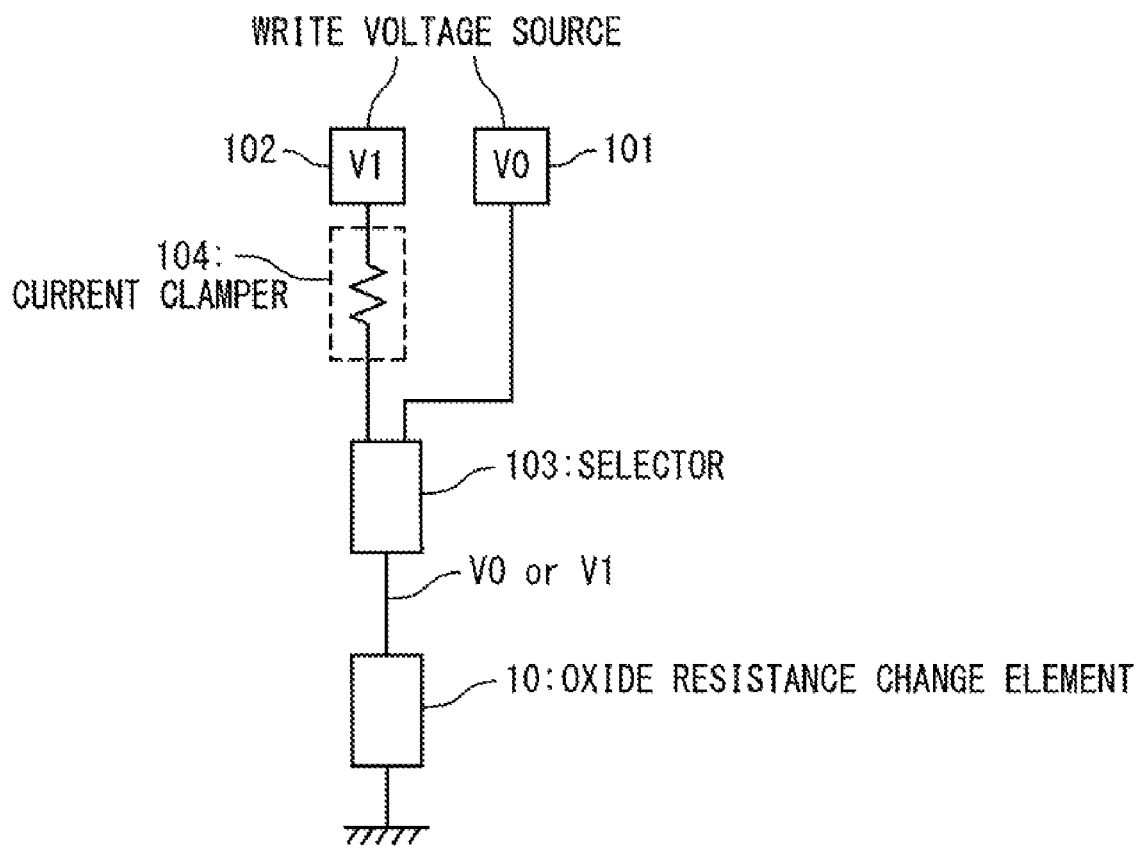
FIG. 2 is a circuit diagram showing a schematic structure of a typical write circuit for the oxide resistance change element.
Figure 5:
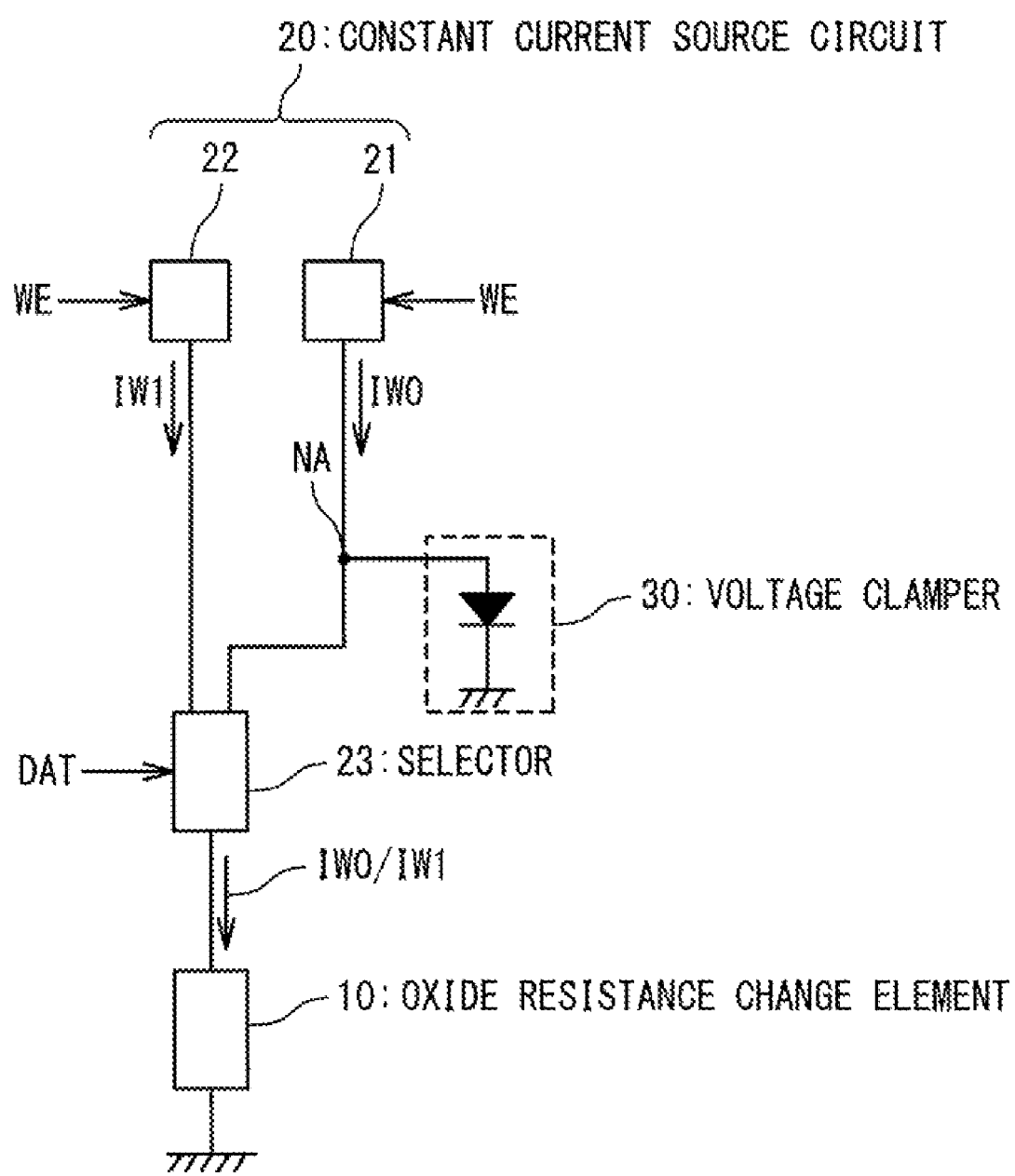
FIG. 5 is a circuit diagram showing a schematic structure of a semiconductor integrated circuit according to a first exemplary embodiment of the present invention.

FIG. 5 shows a schematic structure of a semiconductor integrated circuit according to a first exemplary embodiment of the present invention. The semiconductor integrated circuit includes the oxide resistance change element 10, a constant current source circuit 20, a selector 23, and a voltage clamper 30. The oxide resistance change element 10 has a structure similar to that shown in FIG. 1 and is connected between the selector 23 and the ground.

The constant current source circuit 20 supplies the above write currents IW0 and IW1 to the oxide resistance change element 10. More specifically, the constant current source circuit 20 has a first constant current source 21 and a second constant current source 22. The first constant current source 21 generates the write current IW0 for use in writing data "0" in response to a write signal WE. In contrast, the second constant current source 22 generates the write current IW1 for use in writing data "1" in response to the write signal WE.

The selector 23 is interposed between the constant current source circuit 20 and the oxide resistance change element 10. The selector 23 connects one of the first constant current source 21 and the second constant current source 22 to the oxide resistance change element 10 based on write data DAT. That is, the selector 23 supplies either the write current IW0 or IW1 to the oxide resistance change element 10 based on the write data DAT. Therefore, the data "0" or "1" is selectively written in the oxide resistance change element 10.

The voltage clamper 30 clamps a voltage in a path in which the write current IW0 flows in writing data "0". The voltage clamper 30 is arranged in parallel with the path in which the write current IW0 flows. More specifically, the voltage clamper 30 in FIG. 5 is connected to a node NA on the path disposed between the first constant current source 21 and the selector 23. The voltage clamper 30 includes, for example, a diode. It is therefore possible to prevent a voltage from increasing to reach a predetermined value or higher in the path in which the write current IW0 flows. That is, the oxide resistance change element 10 is prevented from being supplied with a large voltage with a value equal to or more than a predetermined value.

As explained above, data writing for the oxide resistance change element 10 is controlled by the write currents IW0 and IW1 instead of a write voltage. The voltage clamper 30 can be arranged in parallel with the path in which the write current IW0 flows. Accordingly, the write currents IW0 and IW1 can be controlled accurately with a stabilized write operation.

Note that the clamper 30 is preferably laid out in a position close to the oxide resistance change element 10 as much as possible in order to suppress effects of a parasitic resistance in the wiring. In FIG. 5, for example, a wiring length between the oxide resistance change element 10 and the voltage clamper 30 (i.e. node NA) is preferably shorter than a wiring length between the constant current source circuit 20 and the voltage clamper 30 (i.e. node NA). Accuracy of a voltage clamp can be therefore sustained.

Figure 6:
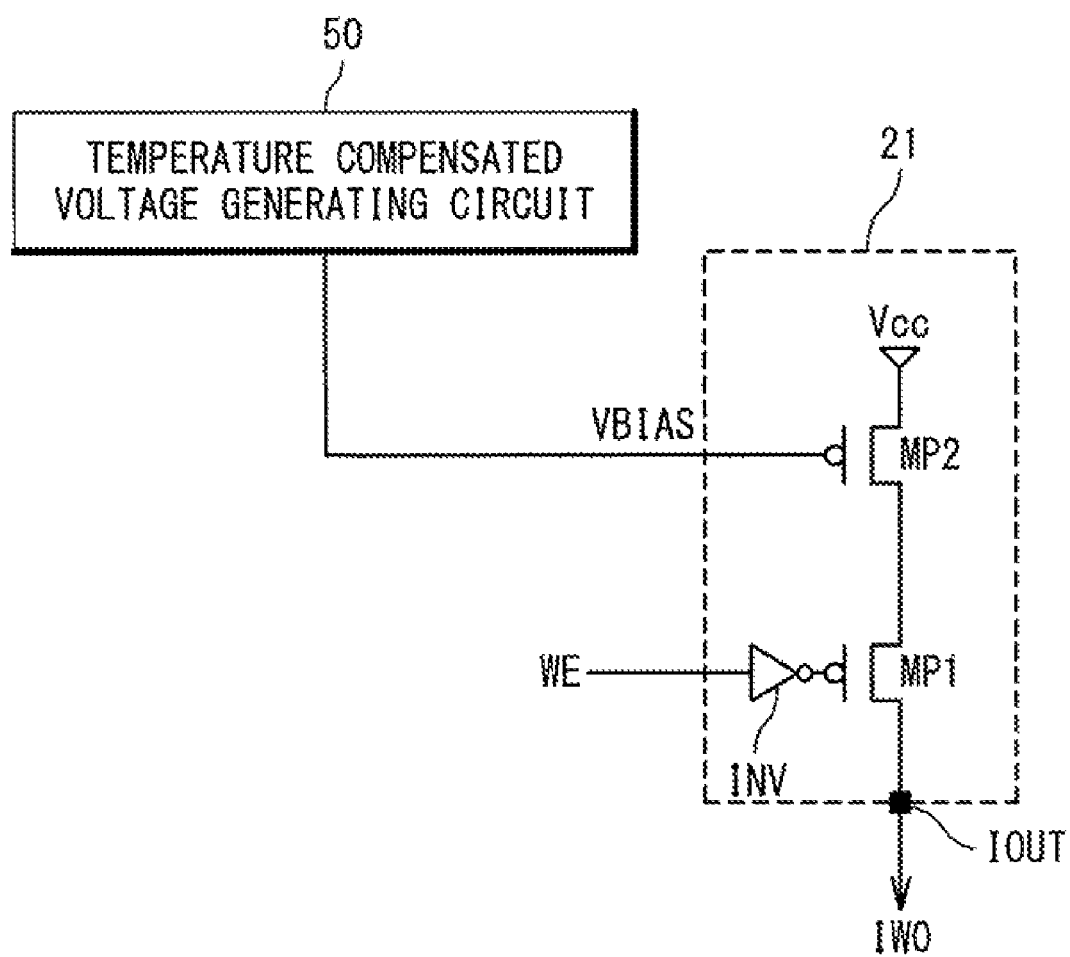
FIG. 6 is a circuit diagram showing one example of a structure of a current source circuit according to the first exemplary embodiment.

FIG. 6 shows one example of a structure of the first constant current source 21. The second constant current source 22 also has a similar structure. In FIG. 6, the first constant current source 21 includes PMOS transistors MP1 and MP2 and an inverter INV. The PMOS transistors MP1 and MP2 are connected in series between a power source terminal (Vcc) and an output terminal IOUT. The value of the write current IW0 is adjusted by a gate width in the PMOS transistors MP1 and MP2.

The PMOS transistor MP1 is a switch transistor to output the write current IW0. The PMOS transistor MP1 has a gate to which the write signal WE is applied via the inverter INV. When the write signal WE in a low level, the PMOS transistor MP1 is turned off. In contrast, when the write signal WE is in a high level, the PMOS transistor MP1 is turned on, and the write current IW0 is outputted from the output terminal IOUT.

Figure 7:
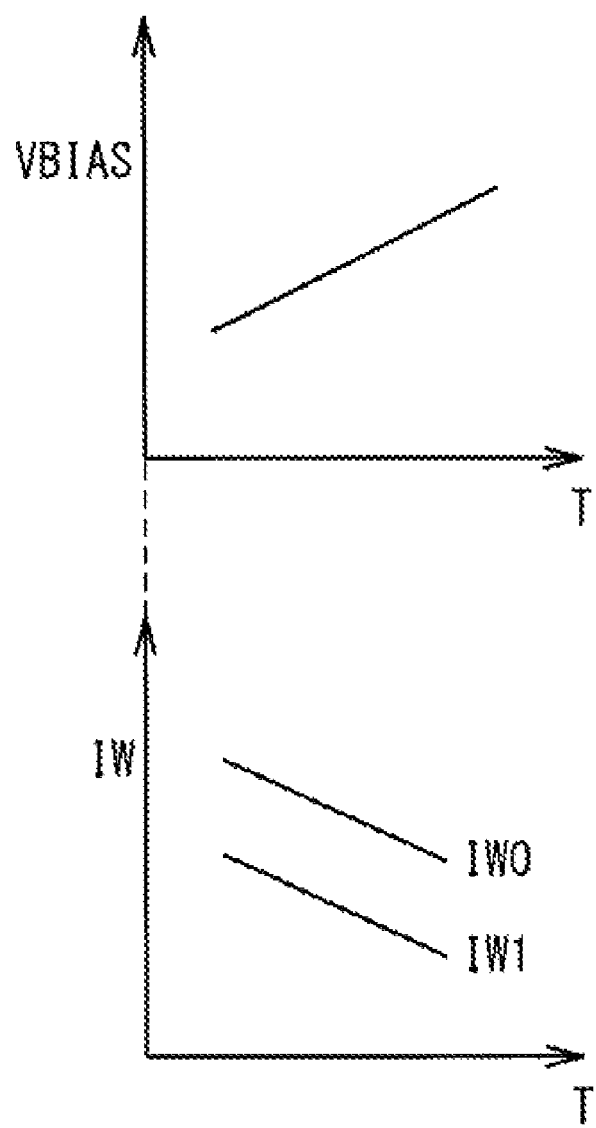
FIG. 7 is a graph to explain temperature compensation regarding a write current.

A value of the write current IW0 to cause data writing has temperature dependency. More specifically, the value of write current IW0 to cause data writing is smaller as the operating temperature increases. Accordingly, the write current IW0 generated by the first constant current source 21 preferably abides by the temperature dependency. The PMOS transistor MP2 is therefore provided. The PMOS transistor MP2 is a temperature compensating transistor for giving the temperature dependency to the write current IW0 outputted from the output terminal IOUT. The PMOS transistor MP2 has a gate to which a control voltage VBIAS is applied. As shown in FIG. 7, the control voltage VBIAS is made higher as the temperature increases. As a result, the write current IW0 outputted from the output terminal IOUT is made smaller as the temperature increases. This operation similarly applies to the write current IW1.

Figure 8:
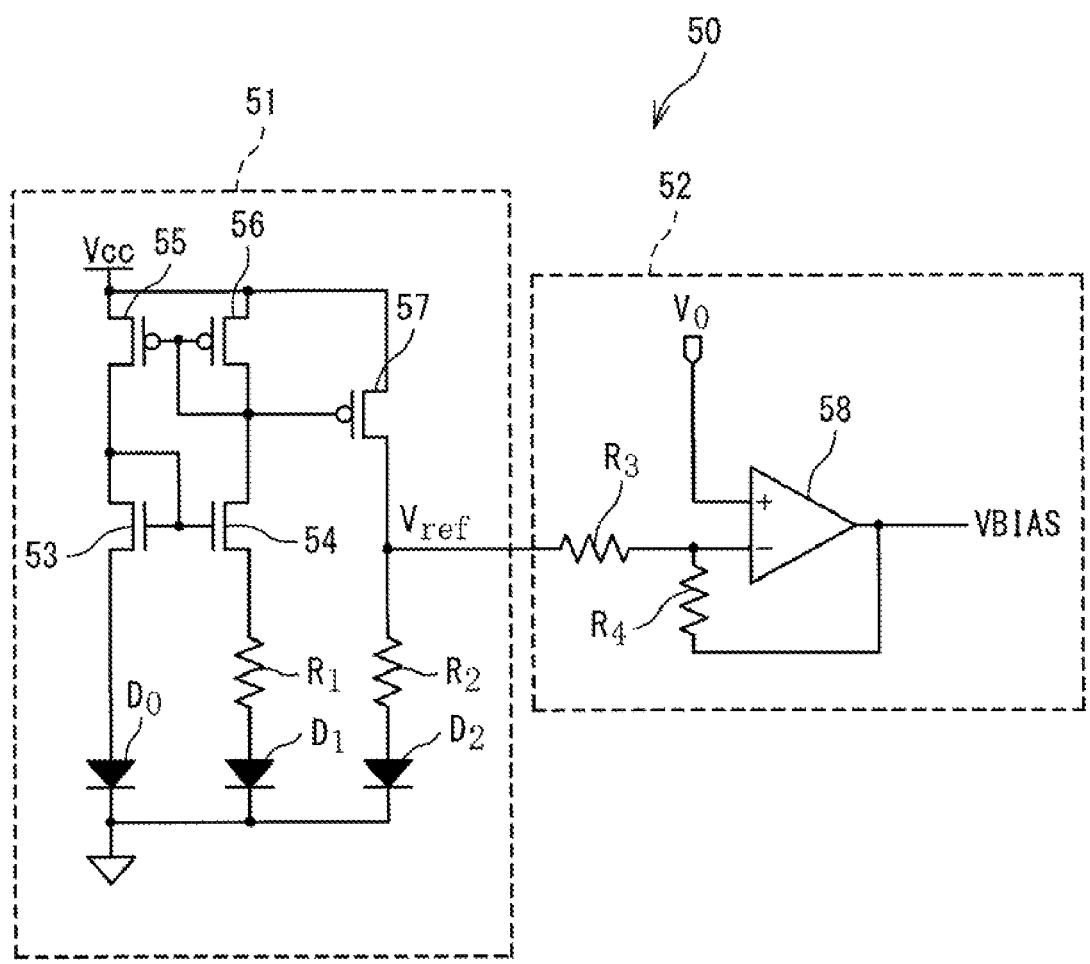
FIG. 8 is a circuit diagram showing one example of a structure of a temperature compensated voltage generating circuit.

The control voltage VBIAS is generated by a temperature compensated voltage generating circuit 50. FIG. 8 shows one example of a structure of the temperature compensated voltage generating circuit 50. The temperature compensated voltage generating circuit 50 includes a reference voltage generating circuit 51 and a voltage converting circuit 52. The reference voltage generating circuit 51 is a circuit for generating a reference voltage $V_{ref}$ in response to an operating temperature, and a band gap reference circuit is typically used as the reference voltage generating circuit 51. The reference voltage generating circuit 51 includes diodes $D_0$ to $D_2$, resistors $R_1$ and $R_2$, NMOS transistors 53 and 54, and PMOS transistors 55 to 57. The voltage converting circuit 52 is a circuit to convert the reference voltage $V_{ref}$ to the control voltage VBIAS, including resistors $R_3$ and $R_4$ and an operational amplifier 58. The temperature compensated voltage generating circuit 50 in such a configuration generates the control voltage VBIAS which is expressed by a following equation:

$$VBIAS=(1+R_4/R_3)V_0-(R_4/R_3)\{V_F+(k_BT/q)\cdot(R_2/R_1)\ln(N)\}$$

Here, $V_F$ is a junction potential of the diode $D_2$; N is an area ratio of PN junction of the diodes $D_0$ and PN junction of $D_1$; $k_B$ is a Boltzmann constant; and q is an elementary electric charge. Temperature dependency in the control voltage VBIAS can be controlled by the resistors $R_1$ to $R_4$, N and a value of the voltage $V_0$ which is supplied to a non-inverted input of the operational amplifier 58.

The present exemplary embodiment thus controls the values of the write currents IW0 and IW1 based on an operating temperature. That is, the structure shown in FIG. 6 makes it possible to accurately control the write currents IW0 and IW1 based on an operating temperature. Under the consideration of temperature dependency, a write operation is further stabilized.

2. Second Exemplary Embodiment

Figure 9:
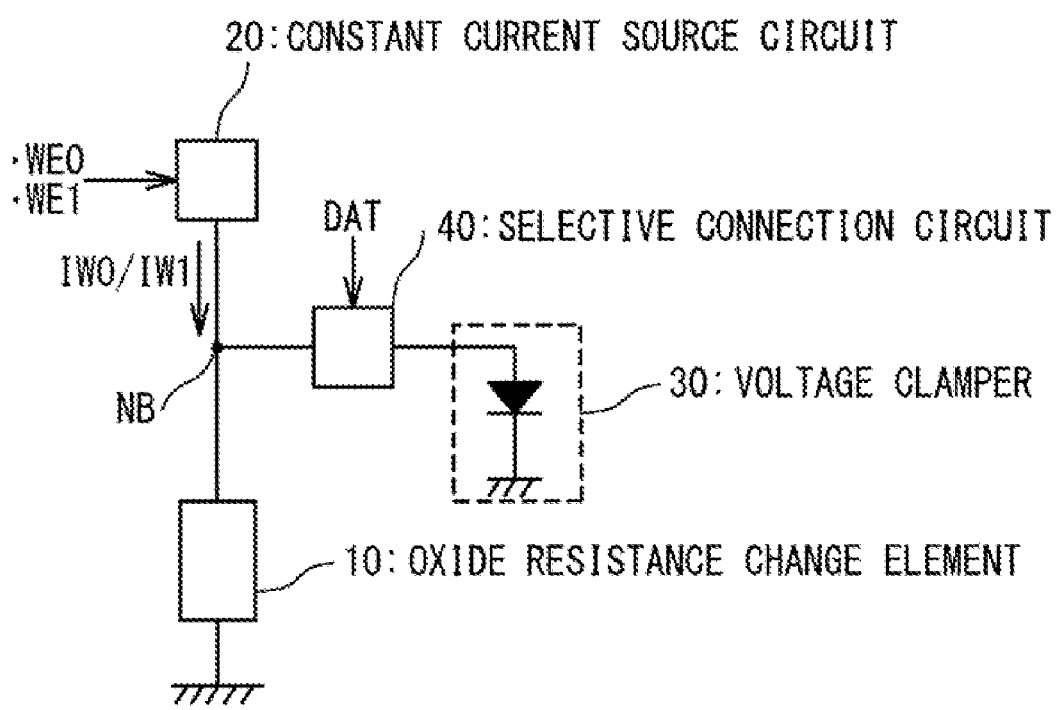
FIG. 9 is a circuit diagram showing a schematic structure of a semiconductor integrated circuit according to a second exemplary embodiment of the present invention.

FIG. 9 shows a schematic structure of a semiconductor integrated circuit according to a second exemplary embodiment of the present invention. Explanation to repeat the first exemplary embodiment will be appropriately omitted. The semiconductor integrated circuit shown in FIG. 9 includes the oxide resistance change element 10, the constant current source circuit 20, the voltage clamper 30, and a selective connection circuit 40. In the present exemplary embodiment, the constant current source circuit 20 is shared to write data "0" and "1".

Figure 10:
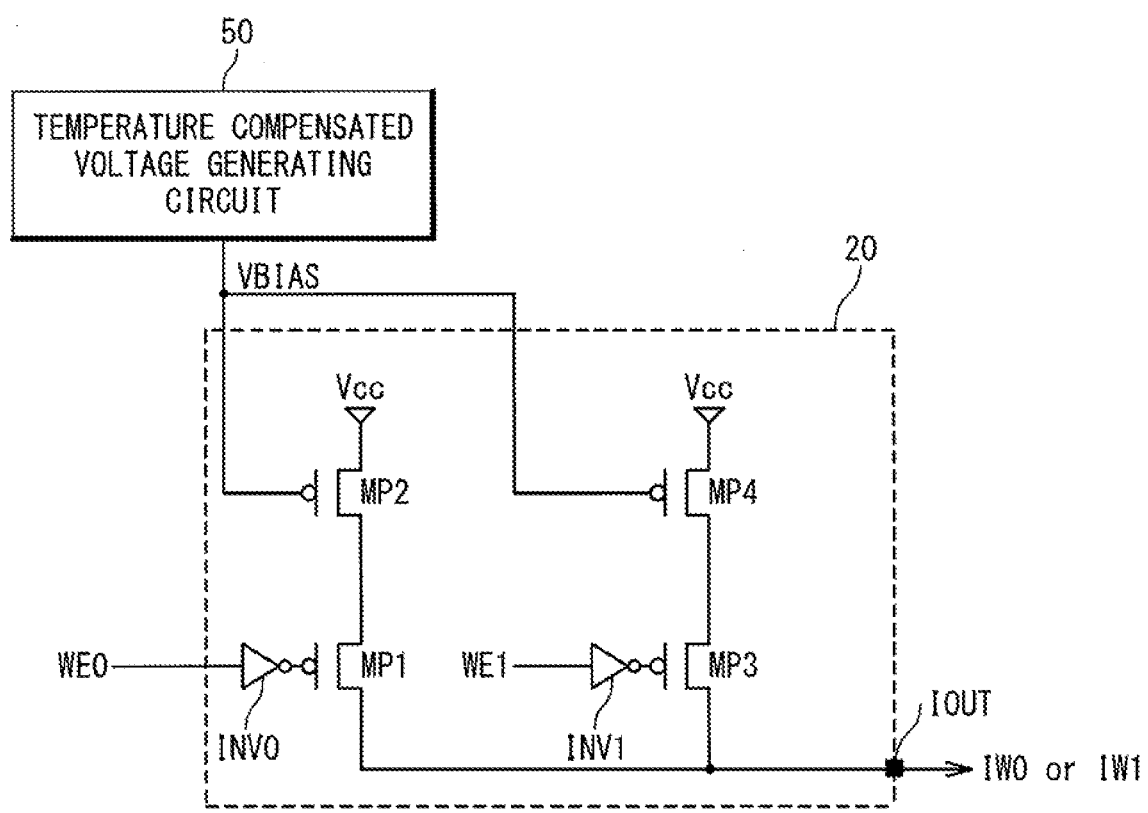
FIG. 10 is a circuit diagram showing one example of a structure of a current source circuit according to the second exemplary embodiment.

FIG. 10 shows one example of a structure of the constant current source circuit 20 according to the present exemplary embodiment. The constant current source circuit 20 includes PMOS transistors MP1 to MP4 and inverters INV0 and INV1.

The PMOS transistors MP1 and MP2 are connected in series between a power source terminal and the output terminal IOUT. The PMOS transistor MP1 is a switch transistor having a gate to which a write signal WE0 is applied via the inverter INV0. The write signal WE0 in a low level causes the PMOS transistor MP1 to be turned off. In contrast, the write signal WE0 in a high level causes the PMOS transistor MP1 to be turned on. The PMOS transistor MP2 is a transistor for temperature compensation having a gate to which the above control voltage VBIS is applied.

The PMOS transistors MP3 and MP4 are also connected in series between a power source terminal and the output terminal IOUT. The PMOS transistor MP3 is a switch transistor having a gate to which a write signal WE1 is applied via the inverter INV1. The write signal WE1 in a low level causes the PMOS transistor MP3 to be turned off. In contrast, the write signal WE1 in a high level causes the PMOS transistor MP3 to be turned on. The PMOS transistor MP4 is a transistor for temperature compensation having a gate to which the above control voltage VBIS is applied.

For example, in writing data "0", the write signal WE0 is set to a high level and the write signal WE1 is set to a low level. Therefore, the write current IW0 is outputted from the output terminal IOUT. In contrast, the write signal WE0 is set to a low level and the write signal WE1 is set to a high level in writing data "1". Therefore, the write current IW1 is outputted from the output terminal IOUT. The write current IW0 is established to be larger than the write current IW1. Values of the write currents IW0 and IW1 are adjusted by a gate width in the PMOS transistors MP1 to MP4. Alternatively, both of the write signals WE0 and WE1 may be set to a high level in writing data "0" while only one of the write signals WE0 and WE1 to a high level in writing data "1". In this case, the write currents IW0 and IW1 can be generated efficiently.

Each of the PMOS transistors MP2 and MP4 has the gate to which the control voltage VBIAS generated by the above temperature compensated voltage generating circuit 50 is applied. As shown in FIG. 7, the control voltage VBIAS is made higher as the temperature increases. As a result, the write currents IW0 and IW1 outputted from the output terminal IOUT are made smaller as the temperature increases. The write currents IW0 and IW1 are controlled under the consideration of temperature dependency, which is preferable.

Explanation will be made referring to FIG. 9 again. As stated above, the constant current source circuit 20 selectively outputs either the write current IW0 or IW1. The oxide resistance change element 10 is connected between the constant current source circuit 20 and the ground. The write current IW (=IW0 or IW1) outputted from the constant current source circuit 20 is supplied to the oxide resistance change element 10.

In the present exemplary embodiment, the voltage clamper 30 is arranged in parallel with a path in which the write current IW flows. The voltage clamper 30 needs to clamp a voltage in the path only in writing data "0". Therefore, the selective connection circuit 40 is interposed between a node NB and the voltage clamper 30 as shown in FIG. 9. The node NB is present between the constant current source circuit 20 and the oxide resistance change element 10 and disposed on the path in which the write current IW flows.

The selective connection circuit 40 controls connection between the node NB and the voltage clamper 30 based on the write data DAT. More specifically, the selective connection circuit 40 electrically connects the node NB and the voltage clamper 30 in writing data "0". The selective connection circuit 40, on the other hand, cuts off electrical connection between the node NB and the voltage clamper 30 in writing data "1".

Note that the voltage clamper 30 is preferably laid out in a position close to the oxide resistance change element 10 as much as possible in order to suppress effects of a parasitic resistance in the wiring. In FIG. 9 for example, a wiring length made between the oxide resistance change element 10 and the voltage clamper 30 (i.e. node NB) is preferably shorter than a wiring length made between the constant current source circuit 20 and the voltage clamper 30 (i.e. node NB). Therefore, accuracy of voltage clamp can be sustained.

The second exemplary embodiment makes it possible to obtain same effects as the first exemplary embodiment. It is also possible to reduce an area used for the constant current source circuit 20 by sharing the constant current source circuit 20 to write data "0" and data "1".

3. Third Exemplary Embodiment

Figure 11:
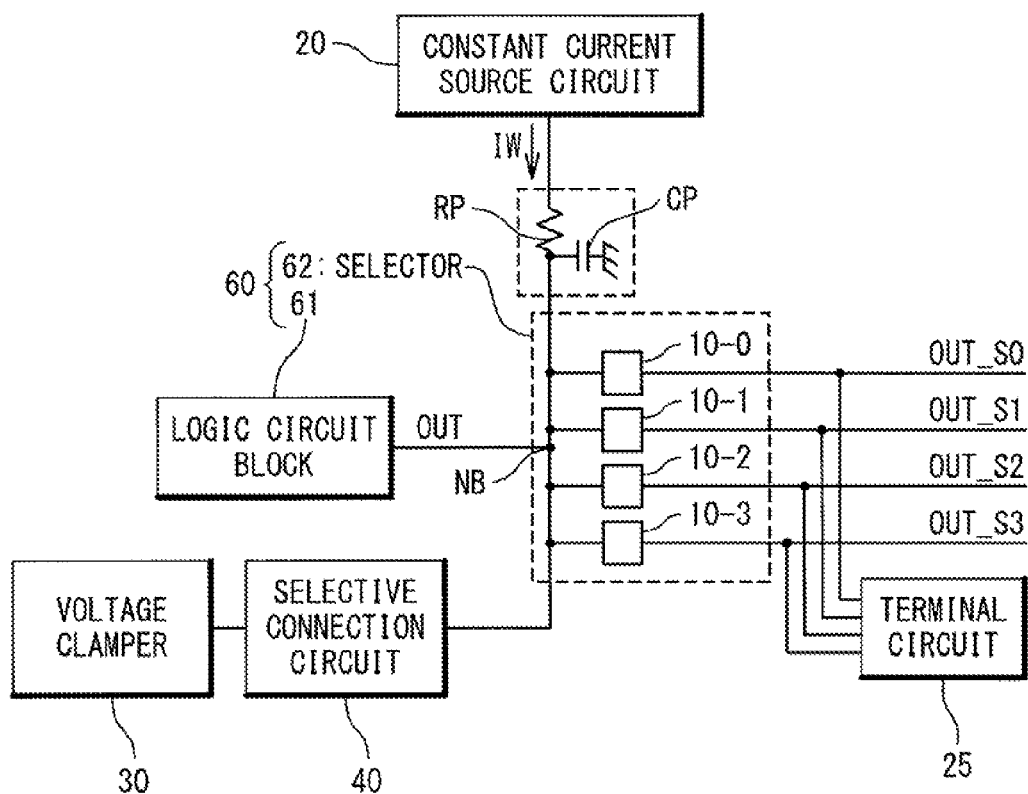
FIG. 11 is a circuit diagram showing a schematic structure of a semiconductor integrated circuit according to a third exemplary embodiment of the present invention.

The oxide resistance change element 10 has an extremely large resistance ratio of a resistance value in a high resistance state to a resistance value in a low resistance state. Accordingly, the oxide resistance change element 10 can be used as a switch included in a logic circuit. FIG. 11 shows an example of using the oxide resistance change element 10 as a wiring switch. As a write circuit for the oxide resistance change element 10, the one shown in the second exemplary embodiment is applied in FIG. 11. As a matter of course, the write circuit shown in the first exemplary embodiment may also be applied.

In FIG. 11, a logic circuit 60 includes a logic circuit block 61 and a selector 62. The selector 62 is arranged between the logic circuit block 61 and four of output wirings OUT_S0 to OUT_S3 so as to selectively output an output OUT of the logic circuit block 61 to four of the output wirings OUT_S0 to OUT_S3. The selector 62 has four of switches corresponding to four of the output wirings OUT_S0 to OUT_S3, respectively. These four switches include four of oxide resistance elements 10-0 to 10-3, respectively.

The output of the logic circuit block 61 is connected to the aforementioned node NB. The output of the constant current source circuit 20 is also connected to the node NB. The voltage clamper 30 is connected to the node NB via the selective connection circuit 40. The oxide resistance elements 10-0 to 10-3 are connected between the node NB and the output wirings OUT_S0 to OUT_S3, respectively. The output wirings OUT_S0 to OUT_S3 are connected to a write current terminal circuit 25.

In order to change a function of the selector 62, a resistance value may be rewritten in the oxide resistance elements 10-0 to 10-3. At this time, the write current IW is made to flow from the constant current source circuit 20 to the write current terminal circuit 25 by passing through the node NB and the selector 62. The selective connection circuit 40 electrically connects the node NB and the voltage clamper 30 in writing data "0".

One example of function setting in the selector 62 will be explained. First, data "0" is written in the entire oxide resistance elements 10-0 to 10-3 sequentially. In writing data "0" in one oxide resistance change elements 10-i, the write current terminal circuit 25 connects one corresponding output wiring OUT_Si to the ground and brings the remaining output wirings into a floating state. The selective connection circuit 40 electrically connects the voltage clamper 30 to the node NB. After activating the voltage clamper 30, the constant current source circuit 20 is activated. The constant current source circuit 20 outputs the write current IW0. The write current IW0 which is also used to charge a parasitic capacitance in the output wirings in the floating state is finally made to flow only in the oxide resistance change element 10-i to be an object. Data "0" is therefore written in the oxide resistance change element 10-i. Data "0" is similarly written in the entire oxide resistance change elements 10-0 to 10-3.

Thereafter, data "1" is written in any of the oxide resistance change elements 10. For example, data "1" is written in the oxide resistance change element 10-1. At this time, the write current terminal circuit 25 connects the output wiring OUT_S1 to the ground and brings the remaining output wirings into a floating state. The selective connection circuit 40 cuts off connection between the voltage clamper 30 and the node NB. Following next is activation of the constant current source circuit 20 to supply the write current IW1. The write current IW1 which is also used to charge a parasitic capacitance in the output wirings in the floating state is finally made to flow only in the oxide resistance change element 10-1. Data "1" is therefore written in the oxide resistance change element 10-1. That is, only the oxide resistance change element 10-1 is brought into a low resistance state.

In operating the logic circuit 60, the output OUT of the logic circuit block 61 is outputted from one output wiring which is OUT_S1 Note that a voltage in the output OUT at this time corresponds to the read voltage VR. A power source voltage in the logic circuit block 61 typically corresponds to the read voltage VR.

As explained above, the present exemplary embodiment uses the oxide resistance change element 10 as a switch in the circuit. It is therefore made possible to reduce an area used for switches and the selector 62.

4. Fourth Exemplary Embodiment

A path from the constant current source circuit 20 to the oxide resistance change element 10 includes a parasitic resistance RP and a parasitic capacitance CP (refer to FIG. 11). The write current IW outputted from the constant current source circuit 20 is partially consumed to charge the parasitic capacitance CP.

Figure 12:
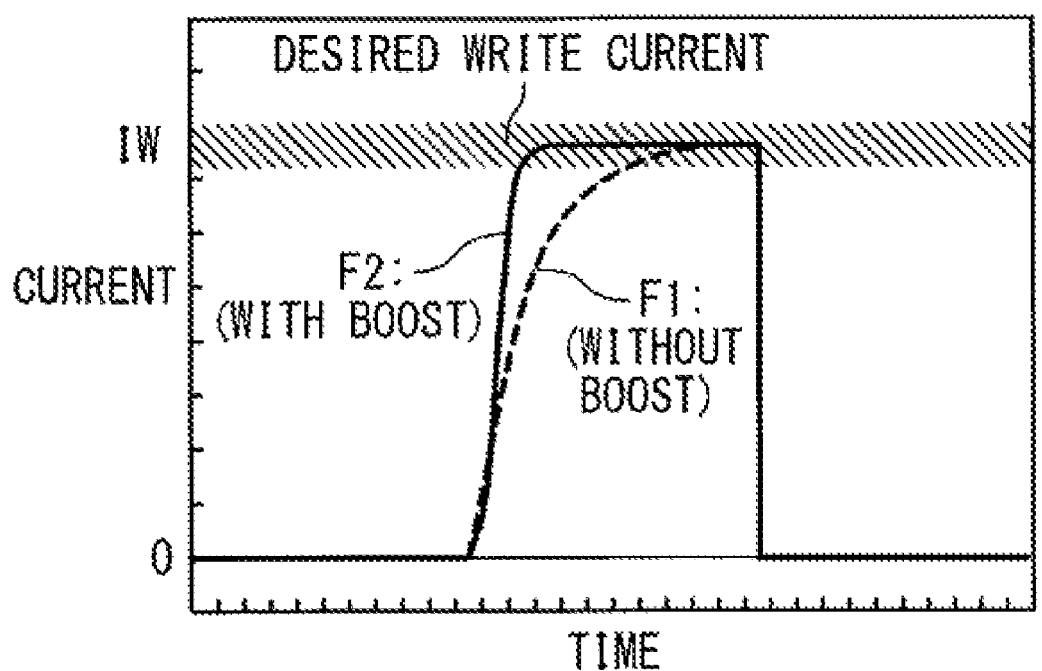
FIG. 12 is a graph showing a waveform of a write current.

FIG. 12 shows a waveform of the write current IW flowing in the oxide resistance change element 10. The write current IW outputted from the constant current source circuit 20 charges the parasitic capacitance CP initially. Therefore, a waveform of the write current IW flowing into the oxide resistance change element 10 is rounded as shown by a waveform F1 in FIG. 12. As a result, prolonged time is required for the write current IW to reach a desired value. A fourth exemplary embodiment will solve this problem.

Figure 13:
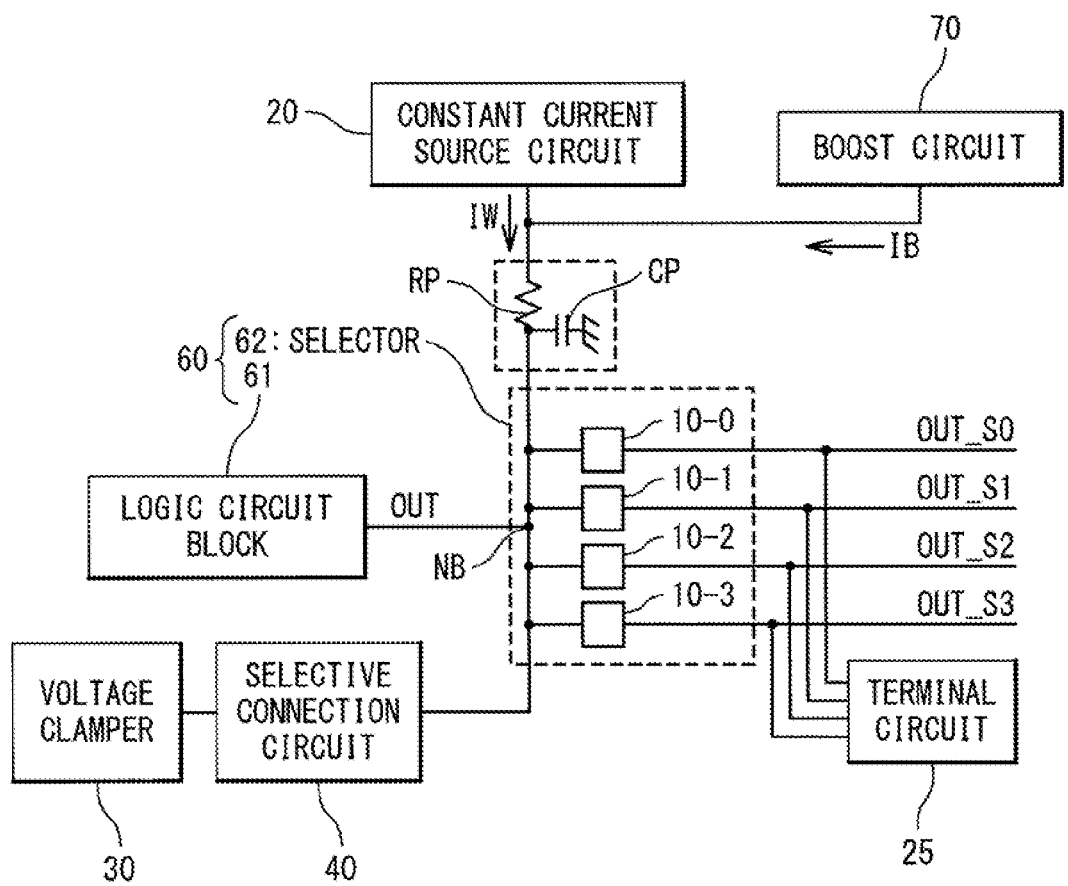
FIG. 13 is a circuit diagram showing a schematic structure of a semiconductor integrated circuit according to a fourth exemplary embodiment of the present invention.

FIG. 13 shows a structure of a semiconductor integrated circuit according to the fourth exemplary embodiment. Like reference numbers refer to like components shown in the aforementioned exemplary embodiments, and repetitive explanation thereof will be omitted appropriately. According to the present exemplary embodiment, a boost circuit 70 is connected to a path in which the write current IW flows. The boost circuit 70 supplies a boost current IB in the path for a predetermined period of time from the start of supplying the write current IW. The boost current IB charges the parasitic capacitance CP in the path immediately after the start of supplying the write current IW. As a result, a period of time required for the write current IW flowing in the oxide resistance change element 10 to reach a desired value is shortened as shown by a waveform F2 in FIG. 12. Accordingly, high-speed data writing is realized with a shortened period of time to write data.

Figure 14:
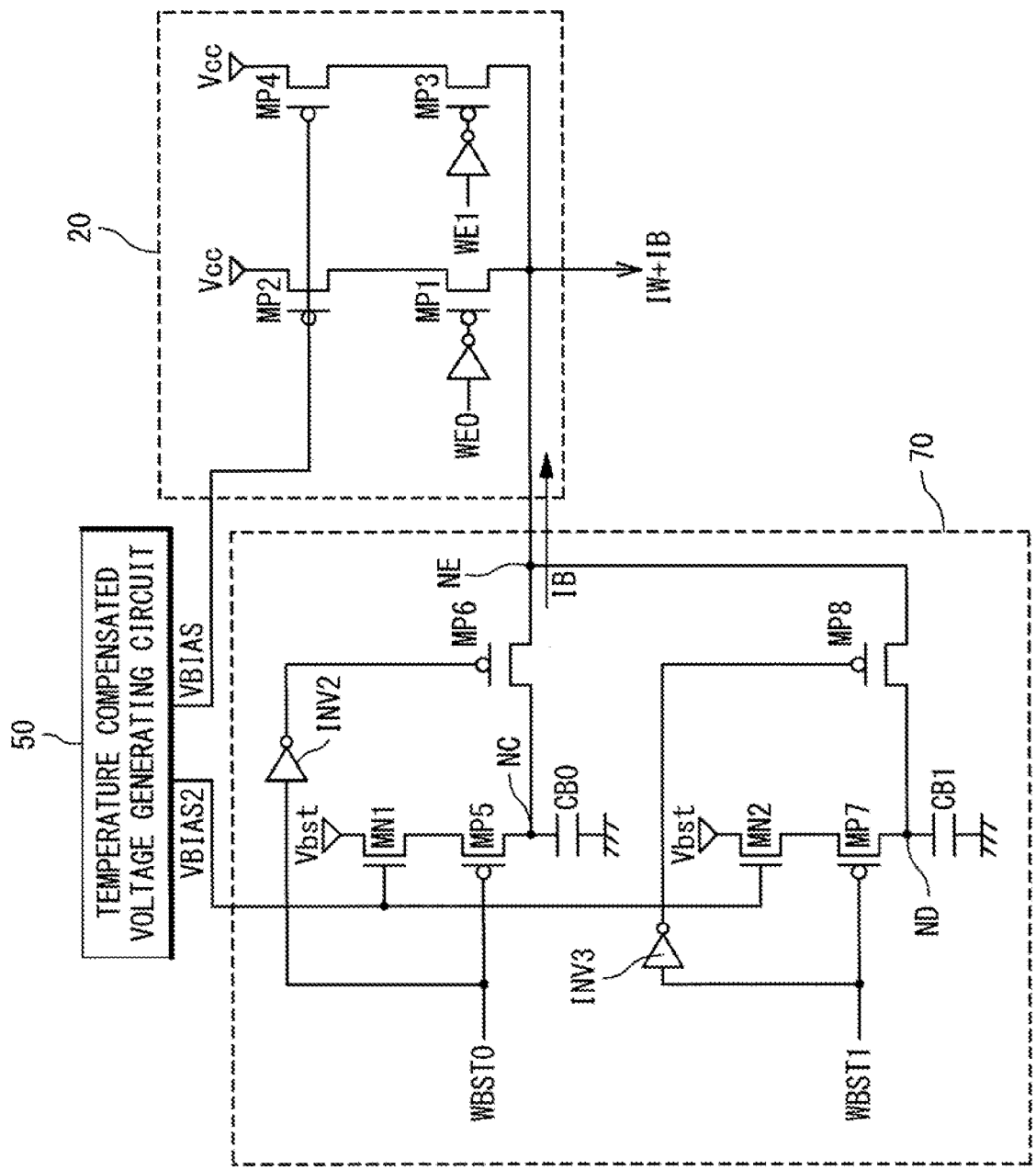
FIG. 14 is a circuit diagram showing one example of a structure including a current source circuit and a boost circuit according to the fourth exemplary embodiment.

FIG. 14 shows one example of a structure including the current source circuit 20 and the boost circuit 70. The current source circuit 20 has a structure similar to that shown in FIG. 10. The boost circuit 70 includes PMOS transistors MP5 to MP8, NMOS transistors MN1 and MN2, inverters INV2 and INV3, and capacitors CB0 and CB1.

The capacitor CB0 is connected between a node NC and the ground. The NMOS transistor MN1 and the PMOS transistor MP5 are connected in series between a power source terminal (Vbst) and the node NC. The PMOS transistor MP6 is connected between the node NC and a node NE. The PMOS transistor MP5 has a gate to which a boost signal WBST0 is applied. The PMOS transistor MP6 has a gate to which a boost signal WBST0 is applied via the inverter INV2.

The boost signal WBST0 in a low level causes the PMOS transistor MP5 to be turned on and the PMOS transistor MP6 to be turned off. At this time, the capacitor CB0 is charged by a power source voltage Vbst (i.e. precharge). The power source voltage Vbst may differ from a usual power source voltage Vcc. The power source voltage Vbst which is higher than the power source voltage Vcc will improve efficiency of charging the capacitor CB0, which is preferable. Thereafter, the boost signal WBST0 is brought into a high level to turn off the PMOS transistor MP5 and turn on the PMOS transistor MP6. As a result, electric charges accumulated in the capacitor CB0 are discharged toward the node NE. That is, the boost current IB is outputted to the path in which the write current IW flows. As stated above, the PMOS transistor MP5 functions as a precharge switch for charging the capacitor CB0, and the PMOS transistor MP6 functions as an output switch for outputting the boost current IB.

Figure 15:
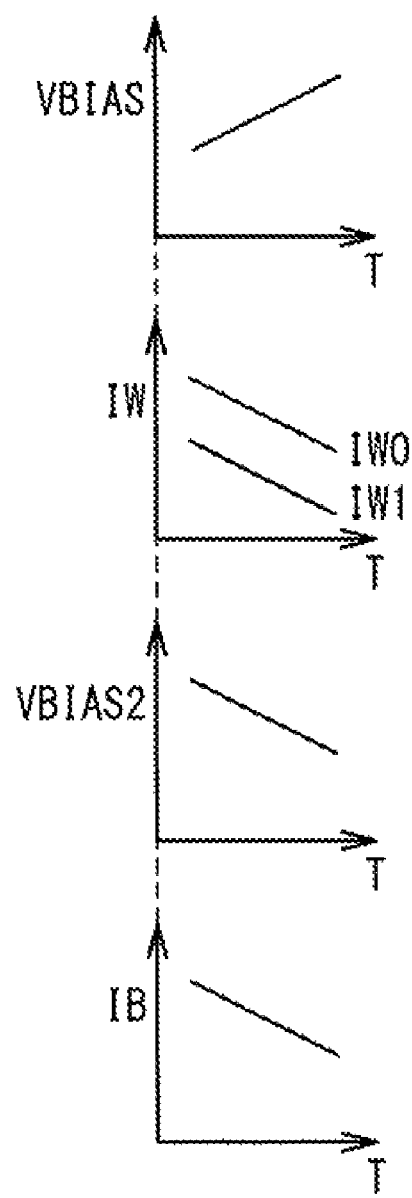
FIG. 15 is a graph to explain temperature compensation regarding a write current and a boost current.

The NMOS transistor MN1 is similar to the PMOS transistors MP2 and MP4 in the constant current source circuit 20 in terms of functioning as a transistor for temperature compensation. That is, the NMOS transistor MN1 gives temperature dependency to the boost current IB. More specifically, the NMOS transistor MN1 has a gate to which a control voltage VBIAS2 generated by the temperature compensated voltage generating circuit 50 is applied. As shown in FIG. 15, the control voltage VBIAS2 is made lower as the temperature increases. Accordingly, an electric charge amount to be charged in the capacitor CB0 is made smaller as the temperature increases. As a result, the boost current IB is also made smaller as the temperature increases, which is similar to the write current IW.

The capacitor CB1 is similarly connected between a node ND and the ground. The NMOS transistors MN2 and the PMOS transistor MP7 are connected in series between a power source terminal (Vbst) and the node ND. The PMOS transistor MP8 is connected between the node ND and the node NE. The PMOS transistor MP7 has a gate to which a boost signal WBST1 is applied. The PMOS transistor MP7 functions as a precharge switch for charging the capacitor CB1. The PMOS transistor MP8 has a gate to which the boost signal WBST1 is applied via the inverter INV3. The PMOS transistor MP8 functions as an output switch for outputting the boost current IB. The NMOS transistor NM2 has a gate to which the above control voltage VBIAS2 is applied. The NMOS transistor MN2 functions as a transistor for temperature compensation.

In writing data "0", the boost signal WBST0 is set to a high level at the same time as the start of supplying the write current IW0. The boost current IB is therefore supplied from the capacitor CB0 in the path in which the write current IW0 flows. That is, the currents IW0 and IB are made to flow in the path. In writing data "1" on the other hand, the boost signal WBST1 is set to a high level at the same time as the start of supplying the write current IW1. The boost current IB is therefore supplied from the capacitor CB1 in the path in which the write current IW1 flows. That is, the currents IW1 and IB are made to flow in the path. The value of boost current IB is set to a value which differs in writing data "0" and writing data "1".

The boost current IB charges the parasitic capacitance CP immediately after the start of supplying the write current IW. As a result, a period of time required for the value of the write current IW flowing in the oxide resistance change element 10 to reach a desired value is shortened. Accordingly, high-speed data writing is realized with a shortened period of time to write data. The present exemplary embodiment further controls not only the write current IW but also the boost current IB in a value corresponding to an operating temperature. Under the consideration of temperature dependency, a write operation is further stabilized.

5. Fifth Exemplary Embodiment

The above forth exemplary embodiment requires a predetermined period of time for the boost circuit 70 to precharge the capacitor. Accordingly, it is necessary to establish a certain period of waiting time between each of continuous write operations in the case of writing data continuously by a burst write or the like. This is not preferable in terms of executing a burst write in a short period of time. A fifth exemplary embodiment will solve this problem.

Figure 16:
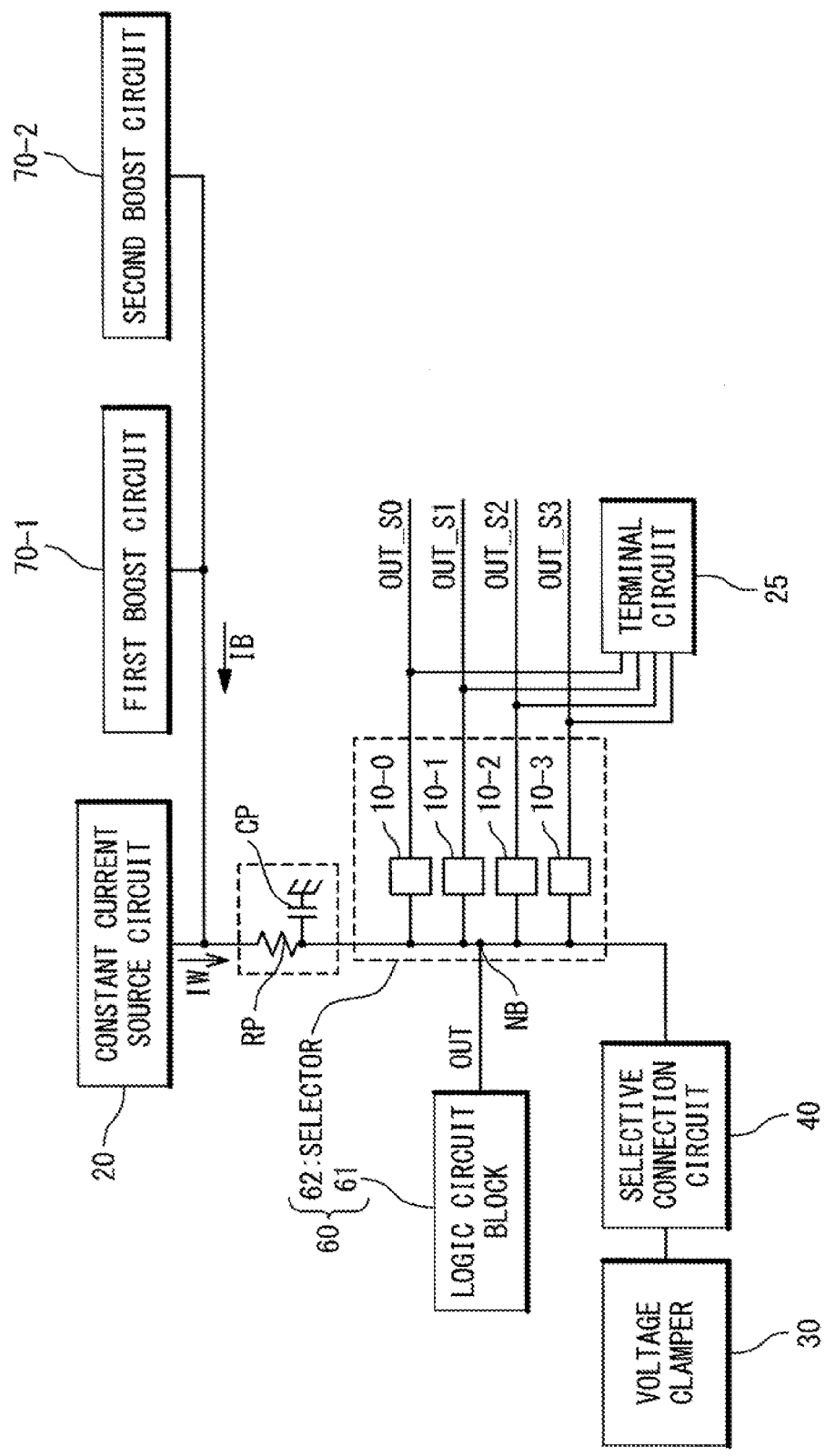
FIG. 16 is a circuit diagram showing a schematic structure of a semiconductor integrated circuit according to a fifth exemplary embodiment of the present invention.

FIG. 16 shows a structure of a semiconductor integrated circuit according to the fifth exemplary embodiment. A same reference numeral is applied to a structure which is same as that of the fourth exemplary embodiment and repetitive explanation thereof will be omitted appropriately. The fifth exemplary embodiment arranges a plurality of boost circuits 70 for one constant current source circuit 20. For example, two of boost circuits 70-1 and 70-2 are connected to a path in which the write current IW flows in FIG. 16. Each of the boost circuits 70-1 and 70-2 has a structure similar to that shown in FIG. 14.

These boost circuits 70-1 and 70-2 are activated alternately. That is, they are activated in time division. Accordingly, while one of the boost circuits 70 carries out a precharge operation, the remaining boost circuit 70 is allowed to output the boost current IB. Data can be therefore written using the boost current IB without break. It is made possible to realize a burst write in a short period of time.

6. Sixth Exemplary Embodiment

Figure 17:
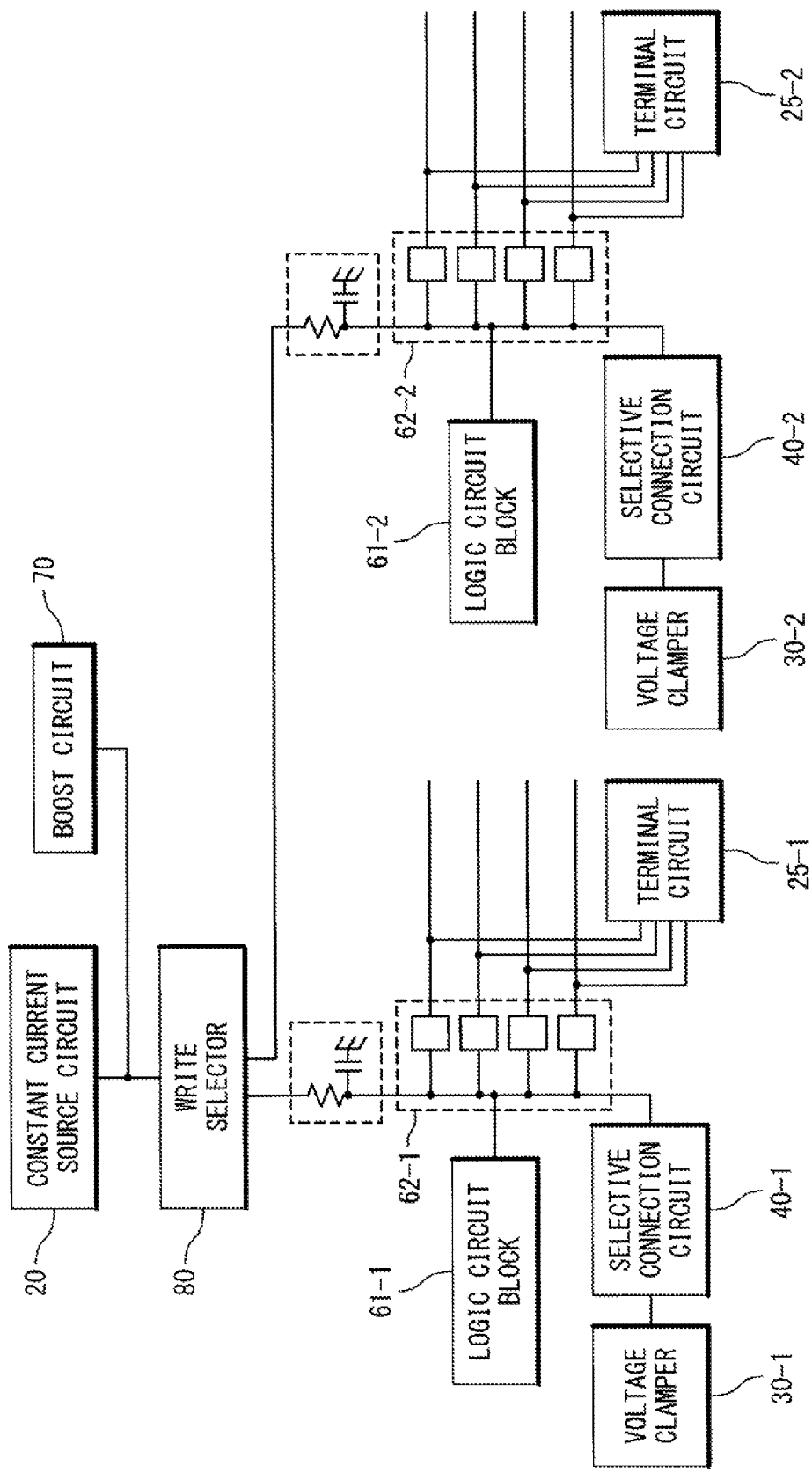
FIG. 17 is a circuit diagram showing a schematic structure of a semiconductor integrated circuit according to a sixth exemplary embodiment of the present invention.

FIG. 17 shows a structure of a semiconductor integrated circuit according to a sixth exemplary embodiment of the present invention. Same reference numerals are applied to structures which are same as those of the aforementioned exemplary embodiments and repetitive explanation thereof will be omitted appropriately. The present exemplary embodiment includes a plurality of groups which are present separately as an object to supply the write current IW. For example, each of two groups has a logic circuit block 61-1 (or 61-2), a selector 62-1 (or 62-2), a voltage clamper 30-1 (or 30-2), a selective connection circuit 40-1 (or 40-2) and a terminal circuit 25-1 (or 25-2), which is similar to the structure shown in FIG. 13.

In the present exemplary embodiment, the constant current source circuit 20 and the boost circuit 70 are shared by the plurality of the groups. A write selector 80 is therefore interposed between the constant current source circuit 20 as well as the boost circuit 70 and the plurality of the groups. The write selector 80 selectively supplies the currents IW and IB to any of the groups. Since the constant current source circuit 20 and the boost circuit 70 each having a large size are shared, a circuit area is reduced as a whole. Note that the value of the boost current IB is preferably controlled corresponding to a distance to a group being an object to write data. More specifically, the boost current IB is set to be larger based on a longer distance from the constant current source circuit 20 to a group being an object to write data. The parasitic capacitance CP is therefore charged sufficiently.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention as defined by the claims.

What is claimed is:

1. A semiconductor integrated circuit comprising:
an oxide resistance change element;
a constant current source circuit configured to supply a write current to said oxide resistance change element; and
a voltage clamper configured to clamp a voltage in a path in which said write current flows,
wherein said voltage clamper is arranged in parallel with said path disposed between said constant current source circuit and said oxide resistance change element,
wherein a state of said oxide resistance change element includes:
a first state in which a resistance value is a first resistance value, and
a second state in which a resistance value is a second resistance value larger than said first resistance value,
wherein said constant current source circuit supplies a first write current to said oxide resistance change element when said oxide resistance change element is brought into transition from said first state to said second state,
wherein said constant current source circuit supplies a second write current to said oxide resistance change element when said oxide resistance change element is brought into transition from said second state to said first state, and
wherein said voltage clamper clamps said voltage in said path when said oxide resistance change element is brought into transition from said first state to said second state.

2. The semiconductor integrated circuit according to claim 1, further comprising:
a selector configured to be provided between said constant current source circuit and said oxide resistance change element,
wherein said constant current source circuit includes:
a first constant current source configured to generate said first write current, and
a second constant current source configured to generate said second write current,
wherein said selector supplies one of said first write current and said second write current to said oxide resistance change element, and
wherein said voltage clamper is connected to a node between said first constant current source and said selector.

3. The semiconductor integrated circuit according to claim 1,
a selective connection circuit configured to be provided between said clamper and a node in said path,
wherein said selective connection circuit connects said voltage clamper and said node when said oxide resistance change element is brought into transition from said first state to said second state.

4. The semiconductor integrated circuit according to claim 1, wherein a wiring length between said oxide resistance change element and said voltage clamper is shorter than that between said constant current source circuit and said voltage clamper.

5. The semiconductor integrated circuit according to claim 1, wherein a value of said write current is controlled based on an operation temperature.

6. The semiconductor integrated circuit according to claim 5, wherein said value of said write current is controlled such that said write current decreases in conjunction with increase of said operation temperature.

7. The semiconductor integrated circuit according to claim 1, wherein said oxide resistance change element constitutes a switch in a logic circuit.

8. A semiconductor integrated circuit comprising:
an oxide resistance change element;
a constant current source circuit configured to supply a write current to said oxide resistance change element;
a voltage damper configured to clamp a voltage in a path in which said write current flows; and
a boost circuit configured to be connected to said path,
wherein said voltage clamper is arranged in parallel with said path disposed between said constant current source circuit and said oxide resistance change element, and wherein said boost circuit supplies to said path a boost current which charges a parasitic capacitance of said path just before a start of supplying said write current.

9. The semiconductor integrated circuit according to claim 8, wherein a value of said write current and a value of said boost current are controlled based on an operation temperature.

10. The semiconductor integrated circuit according to claim 9, wherein said value of said write current and said value of said boost current are controlled such that said write current and said boost current decreases in conjunction with increase of said operation temperature.

11. A semiconductor integrated circuit comprising:
an oxide resistance change element;
a constant current source circuit configured to supply a write current to said oxide resistance change element;
a voltage damper configured to clamp a voltage in a path in which said write current flows; and
a plurality of boost circuits configured to be connected to said path,
wherein said voltage clamper is arranged in parallel with said path disposed between said constant current source circuit and said oxide resistance change element,
wherein each of said plurality of boost circuits supplies to said path a boost current which charges a parasitic capacitance of said path just before a start of supplying said write current, and
wherein said plurality of boost circuits is activated in time division.

* * * * *